United States Patent [19]
Shiraishi

[11] Patent Number: 6,101,267
[45] Date of Patent: Aug. 8, 2000

[54] POSITION DETECTING METHOD AND APPARATUS, AND EXPOSURE METHOD AND APPARATUS

[75] Inventor: Naomasa Shiraishi, Urawa, Japan

[73] Assignee: Nikon Corporation, Tokyo, Japan

[21] Appl. No.: 09/028,364

[22] Filed: Feb. 24, 1998

[30] Foreign Application Priority Data

Feb. 26, 1997 [JP] Japan ..................................... 9-058488

[51] Int. Cl.$^7$ .............................. G06K 9/00; G01B 11/00
[52] U.S. Cl. ............................................ 382/151; 356/401
[58] Field of Search ..................................... 356/399, 400, 356/401; 382/144, 145, 151, 291, 287; 348/95, 87

[56] References Cited

U.S. PATENT DOCUMENTS

| | | | |
|---|---|---|---|
| 4,688,088 | 8/1987 | Hamazaki et al. | 382/151 |
| 4,860,374 | 8/1989 | Murakami et al. | 382/151 |
| 5,500,736 | 3/1996 | Koitabashi et al. | 356/175 |

*Primary Examiner*—Leo H. Boudreau
*Assistant Examiner*—Shawn B Cage
*Attorney, Agent, or Firm*—Oliff & Berridge, PLC

[57] ABSTRACT

A plurality of alignment marks disposed on a substrate is photoelectrically detected, and detected photoelectric signals are added to phase-shifted signals produced by shifting the phase of the detection signals to produce a sum signal. The phase is shifted by quantities corresponding to the intervals between the marks to superpose the peaks of the detection signals on the peaks of the phase-shifted signals. A correlation is determined between the sum signal and a reference signal corresponding to the narrow width of detection. A position where the coefficient of correlation is a maximum value is taken as the mark position. Thus, it is possible to use a reference signal having less peaks and a narrow width in the detecting direction, so that the number of times of product-sum calculation for calculation of the correlation can be small as compared with that when a reference signal having as many peaks as the marks and a same periodicity. The mark can be detected in a shorter time to raise the throughput of a mass production of semiconductor devices which are produced by exposing a substrate.

31 Claims, 4 Drawing Sheets

POSITION DETECTING METHOD AND APPARATUS, AND EXPOSURE METHOD AND APPARATUS

BACKGROUND OF THE INVENTION

1. Field of the Invention

The present invention is concerned with a position detecting method and apparatus, and an exposure method and apparatus including the position detecting method and apparatus, respectively. More particularly, the invention relates to a method and apparatus for detecting, by a method of correlation using a predetermined reference signal, the position of an alignment mark provided on a substrate such as a wafer or the like, and to an exposure method and apparatus adopting the position detecting method and apparatus, respectively.

2. Description of Related Art

During the photolithography process used for producing, for example, semiconductor elements, image pick-up elements (e.g., CCD), liquid crystal display elements, membrane magnetic heads or the like, an image of a mask pattern is transferred onto a photoresist coated on a substrate. The photolithography is effected using an exposure apparatus. The currently available exposure systems include a projection exposure apparatus (e.g., stepper) which projects a pattern of a reticle as a mask through a projection optical system onto a photoresist-covered wafer or glass plate as a substrate, a proximity type exposure apparatus which transfers a mask pattern directly onto a substrate so as to expose the wafer or plate with the pattern, and the like.

A semiconductor element, for instance, is produced by forming a plurality of layered circuit patterns on a wafer in a predetermined overlapped relationship between them by using any one of the above-mentioned exposure apparatuses. Once a first circuit pattern is formed on the wafer by exposure, a mask or reticle has to be aligned accurately with the first circuit pattern formed within each shot area on the wafer before exposing the wafer with a second and subsequent circuit patterns. To this end, an alignment mark or wafer mark is provided as a position detecting mark on a wafer in any preceding steps up to the lithography. The exposure apparatus is provided with alignment sensors to detect the position of the alignment mark, thereby detecting a precise position of the circuit pattern within each shot area on the wafer.

The actual process of wafer alignment comprises two steps: rough alignment in which two or three relatively large marks formed on a wafer are roughly detected to detect approximate positions of shot areas, and fine alignment to be done following the rough alignment to accurately detect the positions of marks provided at approximately ten places on the wafer.

Alignment sensors used for the aforementioned rough alignment include, for example, a laser beam scanning sensor adapted to radiate a laser beam to near an alignment mark(s) for scanning the mask therewith and then detect the alignment mark(s) position based on variations in intensity of scattered and diffracted parts of the laser beam, an imaging sensor arranged to radiate a monochromatic light or broad-band light to near an alignment mark, image the mark through a detecting optical system and detect the mark position based on the image signal, etc.

Typically, a wafer is positioned on a wafer holder with a positional error of 100 μm or so by positioning, for example, based on the outer shape or profile thereof. For rough alignment of the wafer, the position of the alignment mark should be detected with an accuracy of a few μm or less. Also, since a wafer may possibly have formed thereon some circuit patterns difficult to distinguish from the alignment mark, detection of the alignment mark position on the wafer should be done with a correct distinction from such circuit patterns.

To meet the above needs, it has been proposed as one approach to the rough alignment that an alignment mark having segments disposed on a wafer at predetermined intervals (periodicity) along a direction of detecting the mark position should be detected by any one of the above-mentioned sensors, and detection signals thus acquired be processed in a predetermined manner to detect the mark position. More particularly, the waveforms of the detection signals are sliced at a predetermined slice level (threshold), and a mid point between the intersections of each waveform with the slice level line is taken as the mark position. However, this conventional slicing method is disadvantageous in that if only low-contrast signals can be obtained from the marks, for example, because the intervals between the marks are insufficient, the S/N ratio is not good enough for a high accuracy of the position detection.

To overcome the above drawbacks, it has recently been proposed to calculate a coefficient of correlation of a detection signal, having a certain periodicity, of marks detected by a sensor of any of the above-mentioned types, with a reference signal (template) having imparted thereto a same periodicity as the certain periodicity of the detection signal, and take as the mark position a position where the coefficient of correlation is a maximum value. This will be called a "method of correlation" herein. Since the method of correlation allows to detect the mark position with a good S/N ratio, even marks disposed at insufficient intervals can be detected with a high accuracy.

The conventional method of correlation will be briefly described herebelow with reference to FIG. 4.

FIG. 4A shows a rough alignment mark RM formed on a wafer and comprising three grid patterns M1, M2 and M3 disposed at intervals (periodicity) D1 and D2. FIG. 4B shows the waveform of a detection signal Sig.A' of the alignment mark RM, detected by the conventional laser beam scanning sensor and acquired into a memory. FIG. 4C shows an example of template $T_{mc}$. Similarly to the signal Sig.A', the detection signal of the alignment mark RM, this template $T_{mc}$ has peaks at three places spaced from each other by addresses corresponding to the intervals D1 and D2.

Assume here that D1=20 μm, D2=30 μm and the horizontal resolution for acquisition of the signal Sig.A is 0.1 μm, by way of example. One address on the memory of the signal Sig.A' is equivalent to the horizontal resolution of 0.1 μm in terms of a length on a wafer. The signal Sig.A' is acquired within a range Rsc as shown in FIG. 4B. This acquisition range Rsc for the signal Sig.A' is a sum of the intervals D1 and D2 plus an accuracy (100 μm or so) of the wafer positioning based on the profile of the wafer. Therefore, the signal Sig.A' includes a following approximate number of data:

(100+20+30)/0.1=1,500

Also, the template $T_{mc}$ has an approximate range in terms of a length on the wafer, which is a sum of the intervals D1 and D2 plus a spreading of one peak (e.g., 10 μm or so). Therefore, a following approximate number of data is included in the template $T_{mc}$:

(10+20+30)/0.1=600

Thus, for calculation of a coefficient of correlation between the signal Sig.A' and template $T_{mc}$, it is necessary to do 600 times of multiplication, corresponding to the number of the data included in the template $T_{mc}$, and to sum the products thus obtained (this processing will be referred to as "product-sum calculation" hereafter), because a coefficient of correlation between the signal and template has to be calculated for each positional relation. Further, it is necessary to effect 1,000 times of such product-sum calculation within a range of 100 μm in terms of a length on the wafer, that is, as an address on the wafer. Namely, a total of 600,000 times of the product-sum calculation is required for the above purpose.

As mentioned above, the conventional method of correlation necessitates to calculate a correlation between the entire area (all data) of a signal of a detected mark and a template including as generally many data as the detection signal includes. Therefore, a relatively much time and a high-performance, expensive computing unit are required for the processing of a huge amount of data (data derived from 600,000 times of the product-sum calculation for the case shown in FIGS. 4A to 4C) by the conventional method of correlation.

Also, to complete the above-mentioned 600,000 times of the product-sum calculation, even a remarkably high-speed computer will take a time of 0.1 sec or so, which will be a cause of reducing the throughput of an exposure apparatus particularly used for a mass production of semiconductor devices.

SUMMARY OF THE PRESENT INVENTION

Accordingly, the present invention has an object to overcome the above-mentioned drawbacks of the conventional method by providing a position detecting method and apparatus by which the position of an alignment mark formed on a substrate can be detected in a shorter time and with a high accuracy.

The present invention has also another object to provide an exposure method and apparatus by which the rough alignment can be attained in a shorter time to thereby have an improved throughput.

According to a first aspect of the present invention, a method of detecting positions of a plurality of marks provided on a substrate at predetermined intervals and in a detecting direction, is provided which comprises:

radiating, for example, a light or electron beam to an area on the substrate in which the plurality of marks are provided to acquire detection signals of the marks in the detecting direction;

adding the detection signals to phase-shifted signals, which is produced by shifting phases of the detection signals by quantities corresponding to the predetermined intervals, to generate a sum signal; and correlating the sum signal with a predetermined reference signal to detect the mark positions.

By this method of mark position detection, the sum signal (Sig.S) is produced by adding the detection signals (Sig.A) and their respective phase-shifted signals (Sig.R and Sig.L), and then a coefficient of correlation is calculated between the sum signal (Sig.S) and the reference signal ($T_{mp}$), thereby taking as the mark position a position in which the coefficient of correlation is a maximum (or minimum) value. Therefore, a signal having less peaks and a narrow width in the detecting direction like $T_{mp}$ as in FIG. 3E, may be used as a reference signal. Thus, the number of times of the product-sum calculation required for calculation of a coefficient of correlation is small as compared with that in the conventional method in which a reference signal like $T_{mc}$ in FIG. 4C is used which has as many peaks as the marks and a same periodicity. For detection of a mark position, signal processing can be done in a shorted time and no high-performance, expensive computer is necessary, which will lead to a reduction of manufacturing costs.

In this method, a reference signal may be so generated as to correspond to a part of the signals detected from the plurality of marks. For example, if the detection signals have the peaks corresponding to the plurality of marks, a reference signal may be used which has a waveform corresponding only to one of the signal peaks. On the other hand, in the step of producing the sum signal, a signal phase may be shifted to amplify a detection signal of a predetermined one of the plurality of marks. In this case, the phase shifting may be effected corresponding to the predetermined intervals.

Also in the above-mentioned method, at least three arrays of marks may be formed on a substrate in the detecting direction and at least two of the intervals, D1 and D2, may differ from each other. The waveform of a signal detected from an area on the substrate in which the mark arrays are provided can be phase shifted by quantities corresponding to at least the intervals D1 and D2, respectively, to produce at least two phase-shifted signals. Thereafter, the detection signal and phase-shifted signals may be added together to generate a sum signal. Thus, a correlation can be determined between a reference signal corresponding to a part of the signals composing the sum signal, and the sum signal.

For example, the sum signal has a value Di for each position Xi ($1 \leq i \leq m$ where m is a number of detected data) in the direction of mark position detection within the substrate area in which the plurality of marks are provide, and the reference signal has a value Sj ($1 \leq j \leq n$ where n is a number of data in the reference signal and n<m) predetermined within a narrow position range $\Delta X$ within the area in the detecting direction. After products Sj·Di of the reference signal value Sj and sum signal value Di are calculated one after another within the narrow range $\Delta X$, a correlation can be determined between the sum and reference signals by calculating a following sum from the products:

$$i=n, j=n_{\Sigma_{i=1, j=1}}(Sj \cdot Di)$$

Furthermore, a correlation between the sum and reference signals can be calculated within the substrate area in which the plurality of marks are provided by shifting the data address of the reference signal to determine the mark position from the data address of a reference signal indicative of a maximum coefficient of correlation.

Further in this method of the present invention, when the number of patterns forming the mark is n (n is an integer being 2 or more), the phase-shifted signals may be produced in a number (n−1). Assume here that the patterns count five in number and the patterns are disposed at intervals D01, D02, D03 and D04 in a direction from the mark at one end (negative-going end in the coordinates of the wafer plane). In this case, the above-mentioned phase-shifted signals may be four (i.e., 5−1) in number as derived from phase shifting of the detection signals (Sig.A) by +D02, +(D01+D02), −D03 and −(D03+D04). Also, if the patterns count more in number, the phase-shifted signals may not always be (n−1) in number but the number of them may be (n−2), for example. Thus, when all the patterns composing the mark are disposed at same intervals as well as even if all the different intervals are different from each other, the reference signal may be a signal having a narrow width in the direction of detection, which width being generally corresponding to a detection signal from a single pattern as shown in FIG. 3E, whereby the number of times of the product-sum calculation can further be reduced for calculation of a coefficient of correlation. In addition, a smaller capacity memory may be used to store the data included in the reference signal, and thus the costs of manufacturing be reduced correspondingly.

According to a second aspect of the present invention, an exposure method for exposing, with a circuit pattern formed on a mask, a substrate on which a plurality of alignment marks is disposed at predetermined intervals in a direction, is provided which comprises the steps of:

radiating, for example, a light or electron beam to the plurality of alignment marks to acquire detection signals of the marks in the direction;

shifting the phases of the detection signals by quantities corresponding to the predetermined intervals to generate phase-shifted signals;

adding the detection signals and phase-shifted signals to generate a sum signal;

correlating the sum signal with a reference signal having only a part of the detection signals to detect the positions of the alignment marks; and aligning the substrate with the mask based on the detected positions of the alignment marks and exposing the substrate with the mask pattern.

The present invention also provides an exposure apparatus which permits to shorten the time taken for the rough alignment before proceeding to an exposure step, thereby raising the throughput of a mass production of semiconductor devices.

According to a third aspect of the present invention, an apparatus for detecting the positions of a plurality of alignment marks formed on a substrate at predetermined intervals in a detecting direction, is provided which comprises:

a detecting system for radiating, for example, a light or electron beam to an area on the substrate in which the plurality of alignment marks are provided to acquire detection signals of the marks in the detecting direction; and a computing unit for adding the detection signals to phase-shifted signals produced by shifting the phases of the detection signals by quantities corresponding to the predetermined intervals to generate a sum signal, and calculating a coefficient of correlation between the sum signal and a reference signal to determine the positions of the alignment marks based on the coefficient of correlation.

According to a fourth aspect of the present invention, an exposure apparatus for exposing a sensitive substrate with a circuit pattern formed on a mask, the substrate having formed thereon a plurality of alignment marks disposed at predetermined intervals in a direction, is provided which comprises:

a device for moving the substrate in-plane direction of the substrate;

a detecting system for radiating, for example, a light or electron beam to an area on the substrate in which the plurality of alignment marks are provided to acquire detection signals of the marks in the detecting direction;

a computing unit for adding the detection signals to phase-shifted signals produced by shifting the phase of the detection signals by a quantity corresponding to the predetermined intervals to provide a sum signal, and calculating a coefficient of correlation between the sum signal and a predetermined reference signal to determine the positions of the alignment marks based on the coefficient of correlation; and a controller for controlling the substrate moving device based on the determined alignment mark positions to align the area on the substrate with the mask.

With the mark position detecting apparatus and exposure apparatus according to the present invention, the detecting system (including elements 10 to 16) illuminates a mark (RM) with a beam of light, particles, electrons or the like, for example. When a signal (Sig.A) of the detecting direction (direction in which the mark arrays are disposed) is detected, a computing unit (17) will add the detection signal (Sig.A) and phase-shifted signals (Sig.R and Sig.L) produced by shifting the phase of the detection signal (Sig.A) by quantities corresponding to the predetermined mark array intervals (D1 and D2) in the detecting direction. Also the computing unit will calculate a coefficient of correlation between the sum signal (Sig.S) and a predetermined reference signal ($T_{mp}$) to determine the position of the alignment mark (RM) based on the coefficient of correlation. According to the present invention, after the sum signal (Sig.S) is produced from the detection signal (Sig.A) and phase-shifted signals (Sig.R and Sig.L) as in the above, a coefficient of correlation is calculated between the sum signal (Sig.S) and reference signal ($T_{mp}$), and a position in which the coefficient of correlation is a maximum (or minimum) value is taken as the alignment mark position. Therefore, it is possible to use a reference signal having a reduced number of peaks and a narrow width in the detecting direction (e.g., $T_{mp}$ as shown in FIG. 3E). Thus, the number of times of the product-sum calculation for calculation of the coefficient of correlation can be small as compared with that required in the conventional method in which a reference signal (e.g., $T_{mc}$ as shown in FIG. 4C) having as many peaks as the alignment marks and a periodicity is used. Alignment mark position can therefore be detected in a shorter time of signal processing, and also no high-performance, expensive computing unit is required, which will lead to a reduction of manufacturing costs.

In the exposure apparatus, the controller can drive the substrate moving system incorporating, for example, a wafer stage and a drive unit for the stage according to the detected alignment mark position to align the substrate with the mask. A rough alignment can be attained in a reduced time before proceeding to a step of exposure to raise the throughput of a mass production of semiconductor devices.

The exposure apparatus and mark position detecting apparatus according to the present invention may further comprise a memory for storage of the reference signal and sum signal.

In the present invention, the substrate is a semiconductor substrate on which a plurality of semiconductor devices is formed and an alignment mark may be formed in each area on the substrate in which each of the semiconductor devices is to be formed.

BRIEF DESCRIPTION OF THE DRAWINGS

These objects and other objects, features, and advantages of the present invention will become more apparent from the following detailed description of the present invention when taken in conjunction with the accompanying drawings, in which:

FIGS. 3A to 3E explain together how to process, by a main controller, a photoelectric signal of an alignment mark detected by means of a photosensor, in which FIG. 3A shows an example of photoelectric signal waveform, FIGS. 3B and 3C show phase-shifted signal waveforms derived from phase shifting of the photoelectric signal by −D2 and +D1, respectively, FIG. 3D shows a signal waveform resulted from a sum of the shown in FIGS. 3A to 3C; and FIG. 3E illustrates the signals waveform of a reference signal being a template;

FIGS. 4A to 4C explain together the conventional method of correlation, in which FIG. 4A is an enlarged plan view of an alignment mark provided on a substrate, FIG. 4B shows the waveform of a photoelectric signal detected from the alignment mark shown in FIG. 4A, and FIG. 4C shows the waveform of a reference signal for detection, by the method of correlation, of the alignment mark position shown in FIG. 4A.

DETAILED DESCRIPTION OF THE PREFERRED EMBODIMENTS

One embodiment of the present invention will be described with reference to FIGS. 1 to 3.

Figure 1:
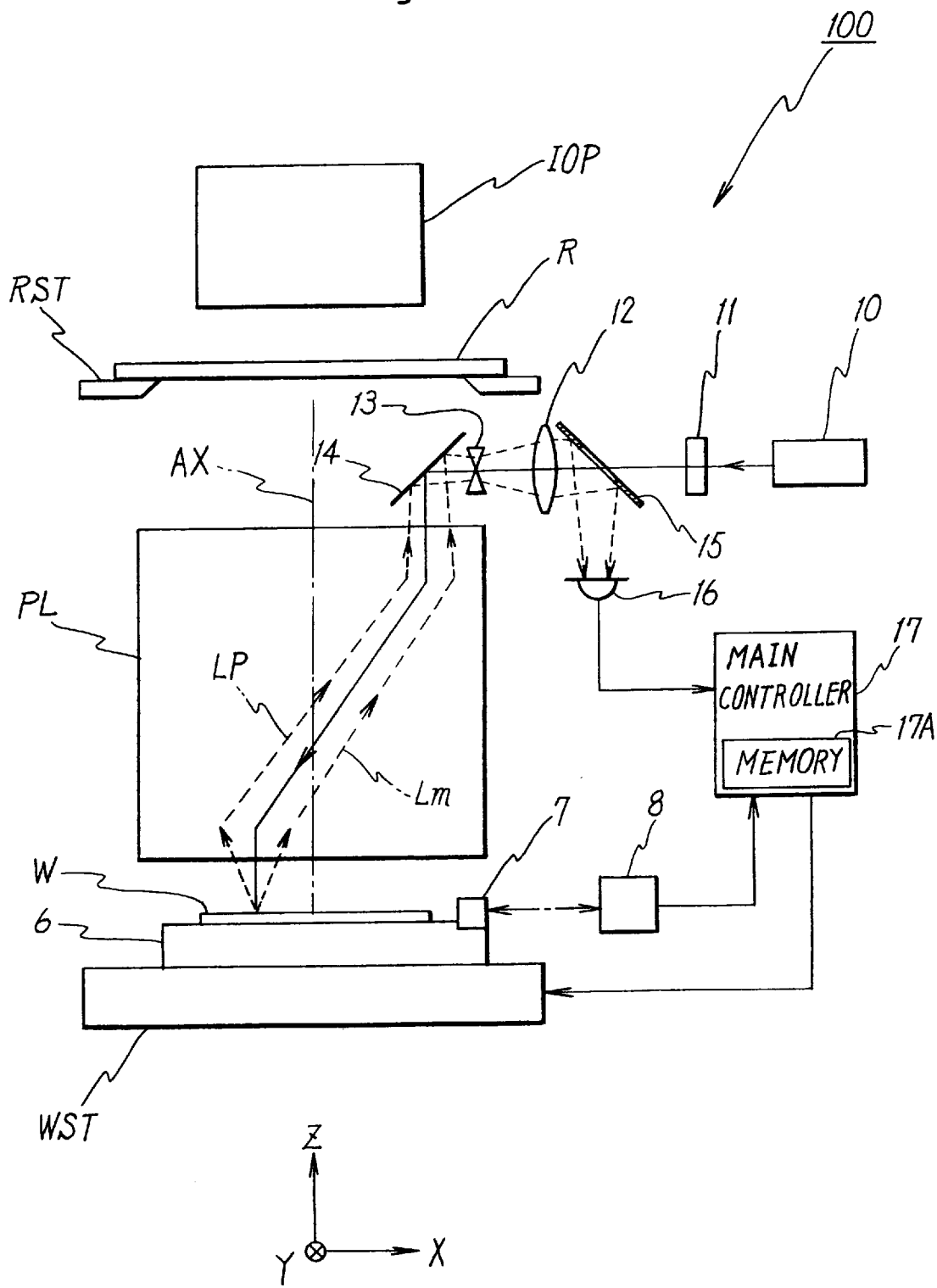
FIG. 1 schematically illustrates the construction of one embodiment of the exposure apparatus according to the present invention.

FIG. 1 schematically illustrates the construction of an projection exposure apparatus 100 according to an embodiment of the present invention, incorporating a TTL (Through the Lens) type alignment optical system intended for the position detection. The exposure apparatus 100 is a step and repeat type reduction projection exposure apparatus (also called "stepper").

The exposure apparatus 100 comprises an illumination optical system IOP for illuminating a reticle R as a mask, a reticle stage RST disposed below IOP to support the reticle R, a projection optical system PL disposed below RST, a wafer stage WST which is movable in two different dimensions below PL and supports the wafer W as a sensitive substrate (or a substrate), and alignment sensors (10 to 16).

The illumination optical system IOP further includes, for example, a uniform-illumination optical system comprising a collimator lens, a fly-eye lens and the like, a relay lens system, a reticle blind, a condenser lens, etc. (all not illustrated). In the exposure apparatus 100 of the above construction, an illumination light from a source (not shown) is directed from above onto a predetermined rectangular area defined on the reticle R by the reticle blind in such a manner as to illuminate the area nearly uniformly. For the illumination light source, any appropriate one may be selected from an excimer laser such as KrF excimer laser, ArF excimer laser or the like, a harmonic such as copper vapor laser or YAG laser, a bright line (g-line or i-line) in the ultraviolet ray band from an ultrahigh pressure mercury lamp, or the like.

The reticle R having a circuit pattern (fine pattern) written on the rear face thereof is secured on the reticle stage RST by vacuum suction, for example. To accurately position the reticle R on the wafer, the reticle stage RST can be inched two-dimensionally (in X-axial direction and Y-axial direction perpendicular to the X-axis, and about Z-axial direction perpendicular to a plane defined by the X- and Y-axes) in a plane perpendicular to the optical axis of the illumination optical system IOP. The optical axis corresponds to that of the projection optical system PL as will be described below.

As shown in FIG. 1, the projection optical system PL is disposed below the reticle stage RST. The direction of the optical axis (coincident with that of the illumination optical system IOP) of the projection optical system is taken as the Z-axial direction. As the projection optical system in the present invention, a refraction optical system is adopted which comprises a plurality of lens elements disposed at predetermined intervals along the optical axis AX to attain a bidirectional telecentric optical geometry. The projection optical system PL is of a reduction type having a predetermined projection power of, for example, ⅕ (or ¼). Therefore, when the reticle R is illuminated with a light from the illumination optical system IOP, the illumination light passing through the reticle R allows a circuit pattern on the reticle R to be projected as reduced through the projection optical system PL onto the photoresist-coated wafer W and thus imaged on the wafer W. Thus, a fine pattern on the reticle R is transferred by exposure to the wafer W.

The wafer stage WST is adapted to be movable on a base (not shown) by a driving system like a linear motor (not shown) in the X-axial direction (horizontal direction in the plane of FIG. 1) and in a Y-axial direction perpendicular to the X-axial direction (direction perpendicular to the plane of FIG. 1). A wafer table 6 is mounted on the wafer stage WST, and a wafer W is to be secured by vacuum suction or in any other way on the wafer table 6 by means of a wafer holder (not illustrated).

The wafer table 6 is positioned in the X-Y direction on the wafer stage WST and secured there for Z-axial movement and tilt. Further, the wafer table 6 is supported by three shafts (not shown) at three different supporting points. The three shafts are driven independently in the Z-axial direction by a drive unit (not shown) in such a manner that the surface geometry (Z-axial position and tilt with respect to the X-Y plane) of the wafer W held on the wafer table 6 is set as desired.

A moving mirror 7 is secured on the wafer table 6 to reflect a laser beam from an external laser interferometer 8. The laser interferometer 8 always detects the position of the wafer table 6 within the X-Y plane, that is, the position of the wafer W, with a resolution of, for example, about 0.01 $\mu$m.

Actually, a moving mirror having a reflecting surface perpendicular to the Y-axial direction and another moving mirror having a reflecting surface perpendicular to the X-axial direction are provided on the wafer table 6 in this embodiment of the present invention. Also, one laser interferometer is provided in the Y-axial direction, and two are provided in the X-axial direction. For the sake of brevity, FIG. 1 illustrates only the moving mirror 7 and laser interferometer 8 which are typical of those actually provided. Information on the position of the wafer table 6 is sent to a main controller 17 which in turn will control the position of the wafer stage WST by a driving system (not illustrated) based on the position information.

The wafer W has formed thereon circuit patterns having been formed up to the preceding steps. For transfer of a reticle pattern onto the wafer, the pattern should be accurately aligned with the existing circuit patterns on the wafer. To this end, a wafer W has usually formed thereon an alignment mark to detect the positions of the existing circuit patterns on the wafer W.

The alignment optical system including elements 10 to 16 is a one destined for detecting the alignment mark on the wafer W. A laser beam scanning sensor is adopted in this embodiment. The elements of this alignment optical system are a laser source 10, cylindrical lens 11, shaping lens groups 12 and 13, bending mirror 14, branching mirror 15 and a detector 16. The branching mirror 15 is a plane mirror open at the center thereof.

Figure 2:
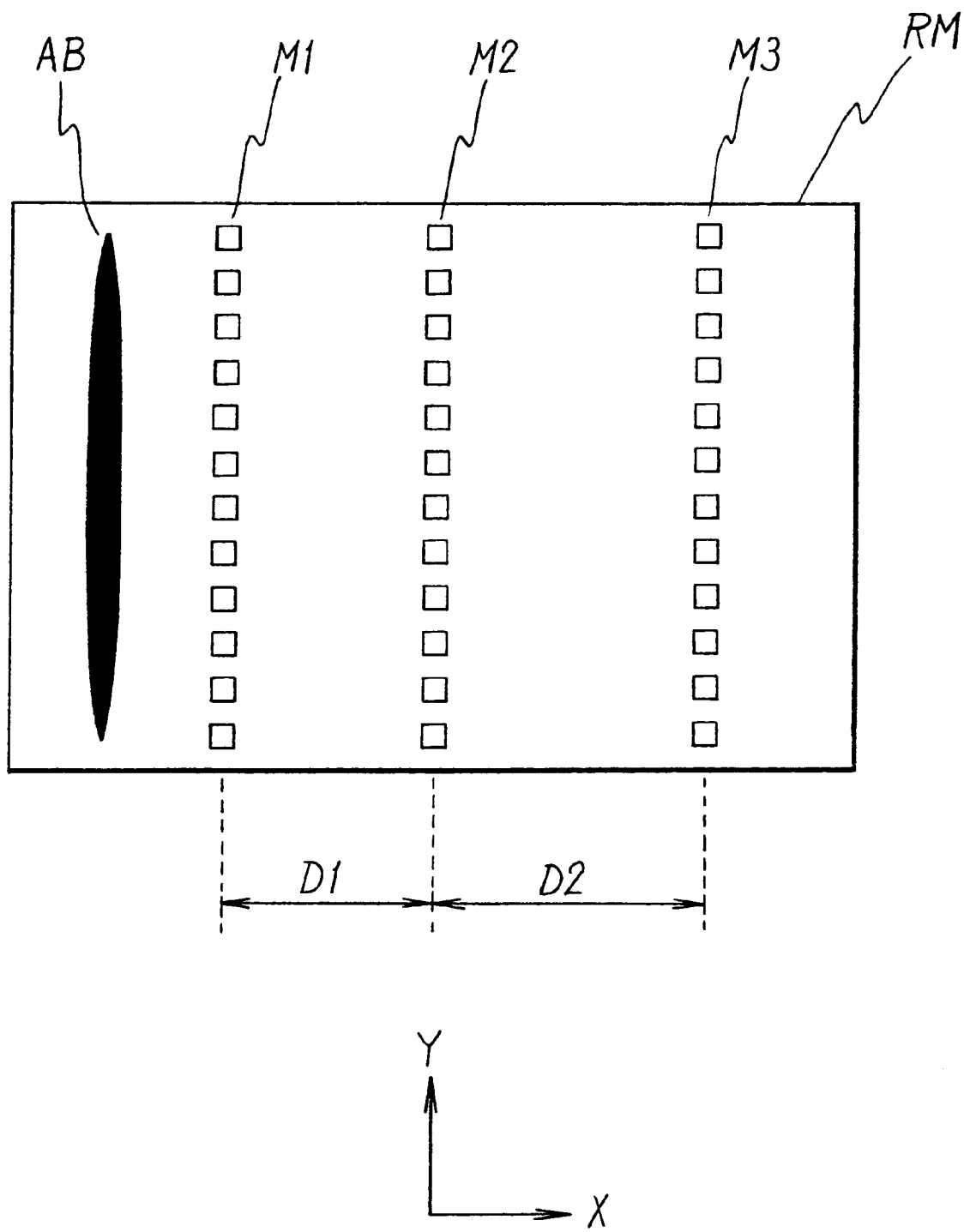
FIG. 2 shows an example of alignment mark formed on a wafer.

The elements of the alignment optical system function during detection of the alignment mark on the wafer W as will be described below:

Assume here that the wafer W has formed thereon a rough alignment mark RM for the rough alignment as shown in FIG. 2 and as having previously been referred to in the description of the related art. The alignment mark RM comprises three grid patterns M1, M2 and M3. Each grid pattern includes square patterns (marks) of which one side is dimensioned a few $\mu$m. In each of the grid patterns, the square patterns (marks) are disposed as spaced the one-side length of the square pattern from one to another in the Y-axial direction (vertical direction in the plane of FIG. 2). The square patterns have a duty ratio of 1. The grid patterns M1 and M2 have a spacing (interval) D1 between them, while the grid patterns M2 and M3 have a spacing D2 between them. The spacings D1 and D2 are 20 m$\mu$ and 30 $\mu$m, respectively.

A laser beam emitted from the laser source 10 is passed through the cylindrical lens 11, shaping lens groups 12 and 13 and the bending mirror 14, and made to be incident upon the wafer W by means of the projection optical system PL. In this case, the laser beam emitted from the laser source 10 is shaped into an elliptical beam AB as shown in FIG. 2 under the action of the cylindrical lens 11, and incident upon the alignment mark RM or the wafer W near the mark RM.

As the wafer stage WST is moved in a direction perpendicular to the patterns M1, M2 and M3 (in the X-axial direction in this case) with the laser beam kept incident upon the alignment mark RM and wafer W, the elliptical laser beam AB is scanned in the X-axial direction over the wafer W so that the patterns M1, M2 and M3 are illuminated one after another with the laser beam AB. Diffracted lights Lp and Lm (as shown in FIG. 1) are generated because of the Y-directional periodicity (spacings) of the square patterns. The diffracted lights Lp and Lm are guided through the projection optical system PL, bending mirror 14 and shaping lens groups 12 and 13, then reflected by the branching mirror 15, and received by the detector 16 in which they are photoelectrically converted to electrical signals. The photoelectric signals are sent to the main controller 17 which will detect the position of the alignment mark RM in the direction of detection (X-axial direction) as will be described below.

Figure 3A:
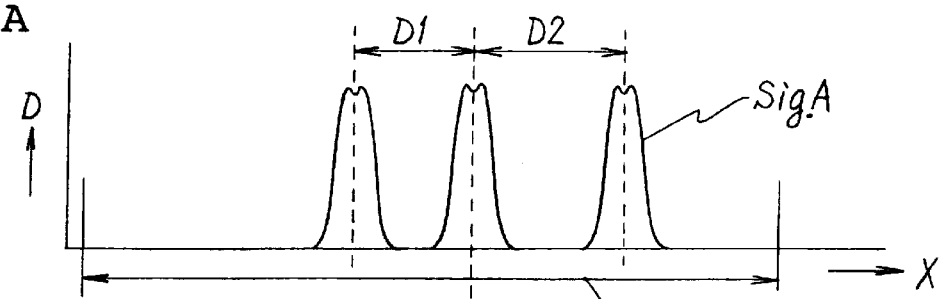
Figure 3B:
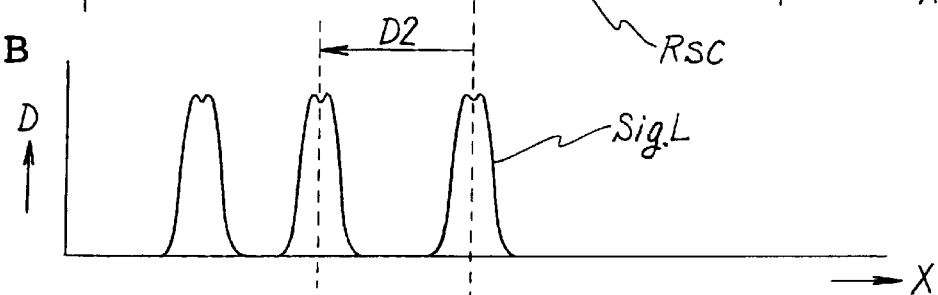
Figure 3C:
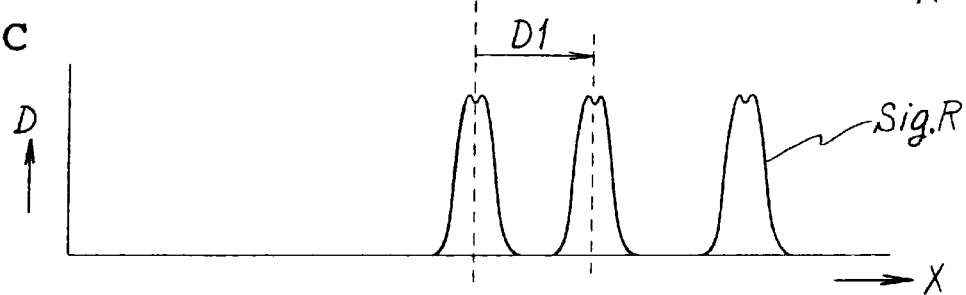
Figure 3D:
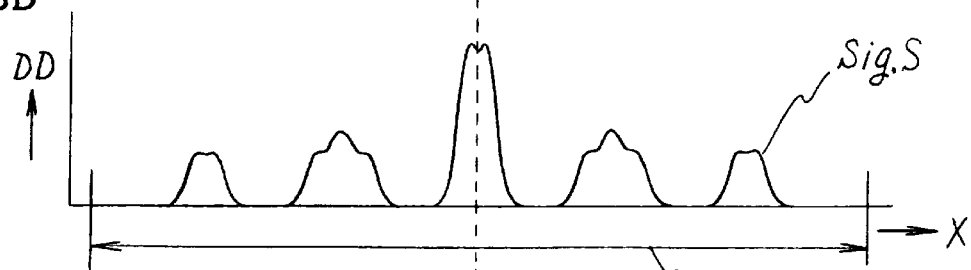

The main controller 17 functions to process the photoelectric signals (detection signals) of the alignment mark, photoelectrically detected by the alignment optical system (10 to 16) as will be described below:

Upon the photoelectric detection of the alignment mark RM by the alignment optical system, A/D converted values of the light quantity signals of the diffracted lights Lp and Lm are acquired into a memory 17A of the main controller 17 synchronously with a pulse from the laser interferometer 8. In this embodiment of the present invention, since the laser interferometer 8 has a resolution of 0.1 $\mu$m, A/D converted values of the photoelectric signals of the diffracted lights Lp and Lm are acquired into the memory 17A each time the wafer stage WST is shifted 0.1 $\mu$m. As a result, an intensity signal Sig.A of the diffracted signals Lp and Lm as shown in FIG. 3A, for example, is acquired into the memory 17A of the main controller 17. The intensity signal Sig.A is nearly same as the photoelectric signal Sig.A' having previously been explained in the description of the conventional method (see FIG. 4B), because the same alignment mark RM is detected and the alignment optical system employs elements similar to those in the conventional laser beam scanning sensor.

Therefore, one address of the signal Sig.A in the memory corresponds to the resolution of 0.1 $\mu$m of the laser interferometer 8 when converted in terms of a length on the wafer W.

The signal Sig.A is acquired within a range Rsc. This acquisition range Rsc of the signal Sig.A is a sum of the above-mentioned intervals D1 and D2 plus an accuracy (100 $\mu$m or so) of wafer positioning based on the profile or the like of the wafer W. Therefore, the number of data included in the signal Sig.A will be approximately:

(100+20+30)/0.1=1,500

Figure 4A:
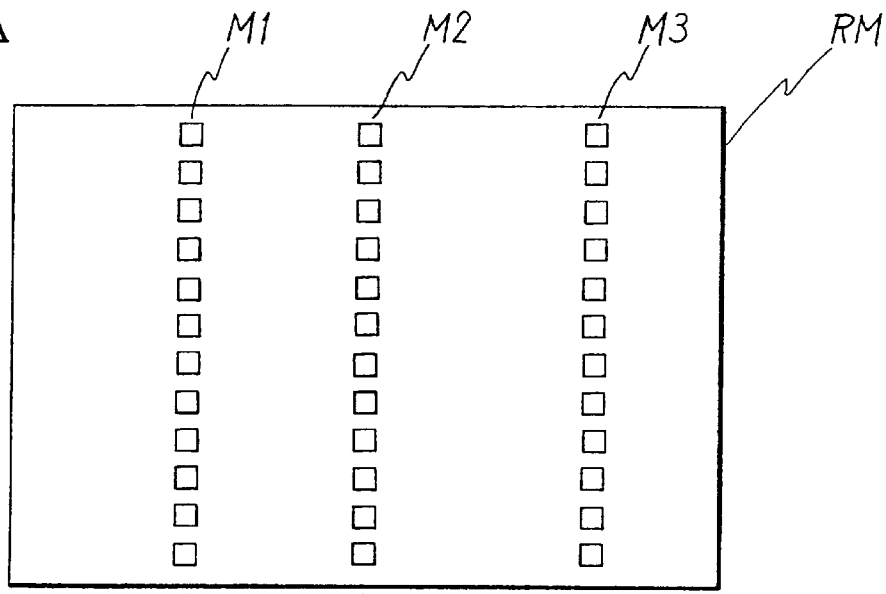
Figure 4B:
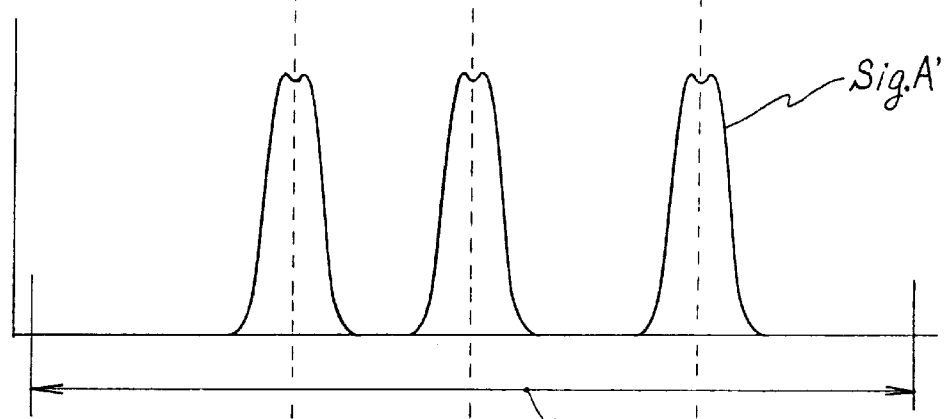
Figure 4C:
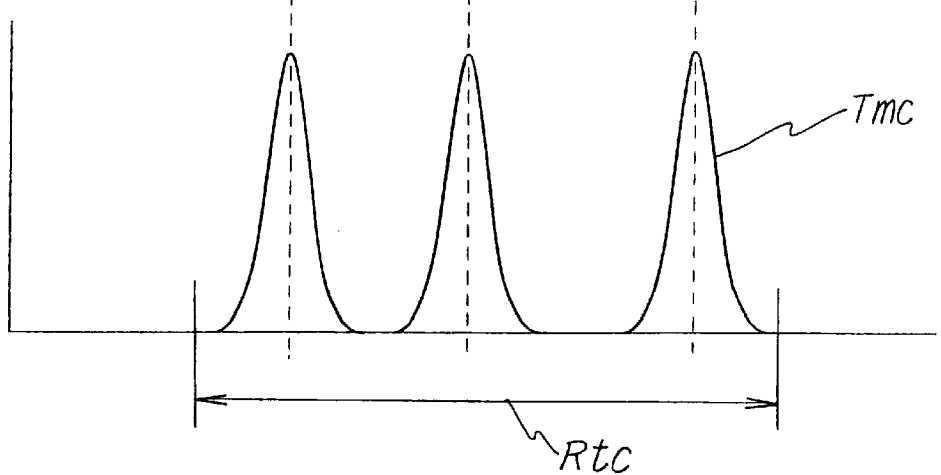

In this respect, this embodiment is similar to the conventional method shown in FIGS. 4A–4C.

Figure 3E:
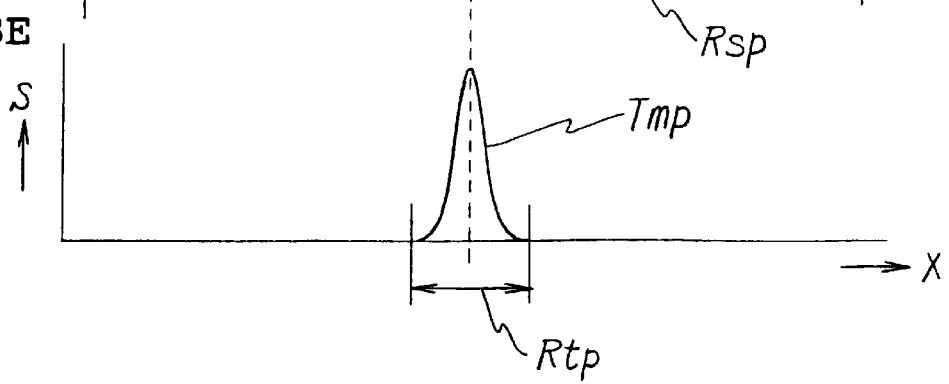

However, this embodiment is significantly different from the conventional method in that a template $T_{mp}$ having a single peak as shown in FIG. 3E is used. For detection of the position of the alignment mark RM based on the correlation with this template $T_{mp}$, this embodiment is further arranged as follows.

The main controller 17 generates a signal Sig.L (as in FIG. 3B) by shifting to the left the phase of the signal Sig.A shown in FIG. 3A by D2 in terms of a length on the wafer W and a signal Sig.R (as in FIG. 3C) by shifting to the right the phase of the signal Sig.A by D1, and also a sum signal (synthetic signal) Sig.S (as in FIG. 3D) by adding these signals Sig.A, Sig.R and Sig.L. Next, the main controller 17 calculates a correlation of the sum signal Sig.S with the template $T_{mp}$ and detects as a mark position a position in which the coefficient of correlation is a maximum value.

This embodiment uses the template $T_{mp}$ having a single peak. Since the range of the template $T_{mp}$ in terms of length on the wafer W is on the order of 10 $\mu$m, the number of data included in the template is nearly:

10/0.1=100

Generally, a template and a photoelectric signal are correlated with each other as follows. For each data (Xj, Sj) ($1 \leq j \leq n$ where n is a number of data included in the template (reference signal) and smaller than the number m of data in the photoelectric signal) of the template, a value Sj of each of the data on the vertical axis, and a value (signal intensity) DDi, on the vertical axis, of the photoelectric signal corresponding to an address i (i=j) of the data in the memory, are multiplied by each other to provide a product Sj·DDi, and the product is added to a total of the cumulative products. This calculation will be called "product-sum calculation" herein. Thus the following value is determined:

$$i=n, \ j=n_{\Sigma_{i=1, \ j=1}}(Sj \cdot DDi)$$

Such a product-sum calculation should be done as to a predetermined range of processing (100 $\mu$m being an accuracy range of positioning based on the profile of a wafer W in this embodiment) while sequentially shifting the template one by one address. Therefore, the magnitude of the number j of data included in the template will greatly affect the number of times of the product-sum calculation under the assumption that the signal processing is done within a constant range.

More specifically, a correlation between the synthetic signal Sig.S and template $T_{mp}$ can be calculated by 100,000 (1,000×100) times of the product-sum calculation in this embodiment. In this respect, the number of times of the product-sum calculation is reduced to about ⅙ of that (600,000 times) required in the conventional method as having previously been described.

For this embodiment of the present invention, however, 3,000 (=2×1,500) times of product-sum calculation are newly added because the three signals Sig.A, Sig.R and Sig.L are added in a first step. But, it can be said that the addition of such 3,000 times of the operation is ignorably small.

In this embodiment, the signal correlation can be fully calculated only with 103,000 (=2×1500+1,000×100) times of product-sum calculation, which is a drastically small number of times as compared with that (600,000 times) in the conventional method.

Also in the embodiment of the present invention, as the signal Sig.S is processed within an accuracy range of wafer positioning based on the profile of the wafer W, the number of data remains 1,000 as in the conventional method. Since the position of alignment mark RM is detected using the method of correlation, a high accuracy of the detection can be attained.

As having been described in the foregoing, the embodiment of the present invention permits a highly accurate detection of the position of an alignment mark formed on a wafer W, and a high speed calculation of signals, which leads to a remarkably reduced time for the detection. For the rough alignment in a stepper like the exposure apparatus 100 according to the present invention, it is necessary to detect, for one wafer, the positions of at least three rough alignment marks in total including two X-axial marks and one Y-axial mark or including one X-axial mark and two Y-axial marks, formed on the wafer W. According to the present invention, the time for rough alignment can be considerably short as compared with that taken in the conventional method, whereby the throughput of a mass production of semiconductor devices can be improved correspondingly.

Furthermore, according to this embodiment, the number of data included in the template $T_{mp}$ is significantly small. Therefore, a memory of a small capacity may be used to store the data, which will largely dedicate to a reduction of the system scale and manufacturing costs.

In the foregoing, the present invention has been described concerning a projection exposure apparatus comprising an alignment optical system using a TTL type laser beam scanning sensor as a position detector. However, the present invention is not limited only to this application, but the position detecting method and apparatus according to the present invention can preferably be applied to any sensor of any other type than TTL, such as a laser scanning sensor, imaging sensor, etc. composing a dedicated off-axis alignment optical system. In case the present invention is applied to an imaging sensor, however, the alignment mark used should conveniently be a multi-bar alignment mark consisting of linear patterns extending vertically in the plane of FIG. 2, not an alignment mark RM consisting of grid patterns M1–M3 as shown in FIG. 2.

Also, the signal Sig.A is not always strong at the positions corresponding to the grid patterns M1, M2 and M3, but may be weaker than other signals at such positions when, for example, an imaging sensor is used to detect the alignment mark. Therefore, in an application of the present invention, such an algorithm should desirably be prepared that a position where the coefficient of correlation is a maximum value as in the foregoing as well as a position where the coefficient of correlation is a minimum value can be detected as a mark position.

Furthermore, the number of the grid patterns forming the alignment mark RM and that of the intervals between the patterns are not limited only to three (M1, M2 and M3) and two (D1 and D2), respectively, as in the foregoing description, but a number n (n is 2 or more) of grid patterns may be disposed at a number (n−1) of intervals, which is more desirable. Also, the number of phase-shifted signals (Sig.L and Sig.R) is not limited only to two as in the foregoing, but the hardware or software should preferably be configured to generate a number (n−1) of such phase-shifted signals.

Moreover, not only a number (n−1), but also a number smaller than n, of phase-shifted signals may be generated for a number n of the grid patterns in an alignment mark. For an alignment mark consisting of, for example, four grid patterns disposed as spaced equidistantly in an alignment mark, two phase-shifted signals are generated by shifting the signal phase by a first quantity +D and a second quantity −2D, and they are added to a detection signal, whereby a synthetic signal waveform having a single maximum peak can be generated. Also in this case, it suffices to use a reference signal corresponding to the single peak.

The embodiment of the present invention has been described as to an application of the position detecting method and apparatus according to the present invention to a step-and-repeat reduction projection exposure apparatus. However, the position detecting method and apparatus according to the present invention is not limited only to such application, but it can also be applied to a step-and-scan projection exposure apparatus as well as to other types of exposure apparatuses such as a proximity exposure apparatus, electron beam exposure apparatus, etc. and to also any other apparatus than an exposure apparatus in which it is necessary to accurately detect the position of a mark.

In the foregoing, the embodiment of the present invention has been described, by way of example, concerning an application in which a laser is used for detecting the position of an alignment mark and as a light source for exposure of a wafer. However, the present invention is not limited to the use of a laser, but can use a particle beam or electron beam.

As having been described in the foregoing, the mark position detecting method and apparatus according to the present invention can be used to detect the position of a mark formed on a wafer accurately and in a short time, which makes it unnecessary to use a high-performance, expensive computing unit and thus reduces the manufacturing costs. Also, the exposure apparatus according to the present invention can attain a rough alignment in a shorter time, to thereby improve the throughput.

What is claimed is:

1. A method of detecting the positions of a plurality of marks provided on a substrate at predetermined intervals in a detecting direction, comprising:

radiating an area on the substrate in which the plurality of marks are provided to acquire detection signals in the detecting direction;

adding the detection signals to phase-shifted signals, which is produced by shifting the phases of the detection signals by quantities corresponding to the predetermined intervals, to generate a sum signal; and correlating the sum signal with a predetermined reference to detect the mark positions.

2. A method as set forth in claim 1, wherein the reference signal is so generated as to correspond to a part of the signals detected from the plurality of marks.

3. A method as set forth in claim 1, wherein the phase shifting is effected so as to amplify a detection signal of a certain one of the plurality of marks.

4. A method as set forth in claim 1, wherein the phase shifting is effected based on the predetermined intervals.

5. A method as set forth in claim 2, wherein at least three arrays of marks are formed on the substrate in the detecting direction and at least two of the intervals, D1 and D2, between the arrays are different from each other, the waveform of a signal detected from an area on the substrate in which the mark arrays are provided is phase shifted by quantities corresponding to at least the intervals D1 and D2, respectively, to produce at least two phase-shifted signals, thereafter, the detection signals and phase-shifted signals are added together to generate a sum signal, and a correlation is determined between the reference signal corresponding to a part of the signals composing the sum signal, and the sum signal.

6. A method as set forth in claim 2, wherein the marks are disposed in a number n (n is an integer being 2 or more) of arrays to generate a number (n−1) of the phase-shifted signals.

7. A method as set forth in claim 2, wherein the substrate is a semiconductor substrate on which a plurality of semiconductor devices are formed by photolithography, the marks being an alignment marks to align an area on the substrate where the semiconductor devices are to be formed.

8. A method as set forth in claim 7, wherein the alignment mark incorporates patterns extending discretely or continually in a direction perpendicular to the detecting direction.

9. An exposure method for exposing, with a circuit pattern formed on a mask, a substrate on which a plurality of alignment marks is disposed at predetermined intervals in a direction, comprising:

radiating the plurality of alignment marks to acquire detection signals in the direction;

shifting the phases of the detection signals by quantities corresponding to the predetermined intervals to generate phase-shifted signals;

adding the detection signals and phase-shifted signals to generate a sum signal;

correlating the sum signal with a reference signal having only a part of the detection signals to detect the positions of the alignment marks; and aligning the substrate with the mask based on the detected positions of the alignment marks to expose the substrate with the mask pattern.

10. A method as set forth in claim 9, wherein the phase shifting is effected so as to amplify a detection signal of a certain one of the plurality of alignment marks.

11. A method as set forth in claim 9, where the phase shifting is effected based on the predetermined intervals.

12. A method as set forth in claim 11, wherein the reference signal represents a waveform similar to that of a peak formed by superposition of one peak of the detection signals on another peak of the phase-shifted signals.

13. A method as set forth in claim 9, wherein at least three arrays of alignment marks are formed on the substrate and at least two of the intervals, D1 and D2, between the arrays are different from each other, the waveform of a signal detected from an area on the substrate in which the alignment marks are provided is phase shifted by quantities corresponding to at least the intervals D1 and D2, respectively, to produce at least two phase-shifted signals, thereafter, the detection signals and phase-shifted signals are added together to generate a sum signal to determine a correlation between the reference signal and the sum signal.

14. A method as set forth in claim 13, wherein three arrays of alignment marks are formed on the substrate in the detecting direction at different intervals D1 and D2.

15. A method as set forth in claim 9, wherein the substrate is a semiconductor substrate on which a plurality of semiconductor devices is to be formed, the alignment marks being formed in each area on the substrate where the semiconductor devices are to be formed.

16. An apparatus for detecting the positions of a plurality of marks formed on a substrate at predetermined intervals in a detecting direction, comprising:

a detecting system for radiating an area on the substrate, in which the plurality of marks are provided, to acquire detection signals in the detecting direction; and a computing unit for adding the acquired detection signals to phase-shifted signals produced by shifting the phases of the detection signals by quantities corresponding to the predetermined intervals to generate a sum signal, and calculating a correlation between the sum signal and a reference signal to determine the positions of the marks based on the coefficient of correlation.

17. An apparatus as set forth in claim 16, wherein the phase shifting is effected to amplify a detection signal of a certain one of the plurality of marks.

18. An apparatus as set forth in claim 16, further comprising a memory to store the reference and sum signals.

19. An apparatus as set forth in claim 16, wherein at least three arrays of marks are formed on the substrate in the detecting direction and at least two of the intervals, D1 and D2, between the mark arrays are different from each other;

the computing unit shifting the phases of the waveforms of signals by quantities corresponding to at least the intervals D1 and D2, respectively, to generate at least two phase-shifted signals, and thereafter, adding the detection signals and phase-shifted signals together to generate a sum signal, to determine a correlation between the reference signal and the sum signal.

20. An apparatus as set forth in claim 19, wherein three arrays of marks are provided at different intervals D1 and D2 in the detecting direction.

21. An apparatus as set forth in claim 16, wherein the substrate is a semiconductor substrate on which a plurality of semiconductor devices are to be formed by photolithography, the marks being alignment marks to align an area of the substrate where the semiconductor devices are to be formed.

22. An apparatus as set forth in claim 21, wherein the alignment mark includes patterns extending discretely or continually in a direction perpendicular to the detecting direction.

23. An apparatus as set forth in claim 16, wherein the computing unit is connected to the detecting system.

24. An exposure apparatus for exposing a sensitive substrate with a pattern formed on a mask, the substrate having formed thereon a plurality of alignment marks disposed at predetermined intervals in a direction, comprising:

a device for moving the substrate in-plane direction of the substrate;

a detecting system for radiating an area on the substrate in which the plurality of alignment marks are provided to acquire detection signals of the marks in the direction;

a computing unit for adding the detection signals to phase-shifted signals produced by shifting the phases of the detection signals by quantities corresponding to the predetermined intervals to generate a sum signal, and calculating a correlation between the sum signal and a predetermined reference signal to determine the positions of the alignment marks based on the coefficient of correlation; and a controller for controlling the substrate moving device based on the determined alignment mark positions to align the area on the substrate with the mask.

25. An apparatus as set forth in claim 24, wherein the phase shifting is effected so as to amplify a detection signal of a certain one of the plurality of alignment marks.

26. An apparatus as set forth in claim 24, further comprising a memory to store the reference and sum signals.

27. An apparatus as set forth in claim 24, wherein at least three arrays of alignment marks are formed on the substrate and at least two of the intervals, D1 and D2, between the arrays are different from each other;

the computing unit shifting the phases of the waveforms of signals detected from the arrays by quantities corresponding to at least the intervals D1 and D2, respectively, to generate at least two phase-shifted signals, and thereafter, adding the detection signals and phase-shifted signals together to generate a sum signal to determine a correlation between the reference signal and the sum signal.

28. An apparatus as set forth in claim 27 wherein three arrays of alignment marks are formed on the substrate at different intervals D1 and D2.

29. An apparatus as set forth in claim 27, wherein the substrate is a semiconductor substrate on which a plurality of semiconductor devices are to be formed, the alignment marks being provided in each area on the substrate where semiconductor devices are to be formed.

30. An apparatus as set forth in claim 24, wherein the computing apparatus effects the phase shifting based on the predetermined intervals.

31. An apparatus as set forth in claim 24, wherein the computing unit is connected to the detecting system.

* * * * *